(12) United States Patent
Takeuchi

(10) Patent No.: US 12,270,907 B2
(45) Date of Patent: Apr. 8, 2025

(54) ELECTROMAGNETIC WAVE DETECTION APPARATUS AND INFORMATION ACQUISITION SYSTEM

(71) Applicant: KYOCERA Corporation, Kyoto (JP)

(72) Inventor: Eri Takeuchi, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 1028 days.

(21) Appl. No.: 17/286,060

(22) PCT Filed: Oct. 21, 2019

(86) PCT No.: PCT/JP2019/041391
§ 371 (c)(1),
(2) Date: Apr. 16, 2021

(87) PCT Pub. No.: WO2020/090558
PCT Pub. Date: May 7, 2020

(65) Prior Publication Data
US 2021/0364640 A1    Nov. 25, 2021

(30) Foreign Application Priority Data
Nov. 1, 2018  (JP) .................. 2018-206478

(51) Int. Cl.
*G01S 17/89*   (2020.01)
*G01S 7/481*   (2006.01)
*G01S 7/4865*  (2020.01)

(52) U.S. Cl.
CPC ............ *G01S 17/89* (2013.01); *G01S 7/4816* (2013.01); *G01S 7/4817* (2013.01); *G01S 7/4865* (2013.01)

(58) Field of Classification Search
CPC ...... G01S 7/4816; G01S 7/4817; G01S 7/486; G01S 7/4863; G01S 7/4865; G01S 7/497; G01S 17/88; G01S 17/89
See application file for complete search history.

(56) References Cited

U.S. PATENT DOCUMENTS

2002/0126024 A1*  9/2002  Kaplan .................. H04B 10/11
                                                      340/984
2004/0119020 A1*  6/2004  Bodkin ................... G01S 17/89
                                                      250/353
(Continued)

FOREIGN PATENT DOCUMENTS

JP    S63-233391 A    9/1988
JP    2003-028959 A   1/2003
(Continued)

*Primary Examiner* — Yuqing Xiao
*Assistant Examiner* — Benjamin Richard Hebert
(74) *Attorney, Agent, or Firm* — Studebaker Brackett PLLC

(57) ABSTRACT

An electromagnetic wave detection apparatus (10) includes a separation unit (16) configured to separate and propagate incident electromagnetic waves in a plurality of directions, a first detector (17) configured to detect separated first electromagnetic waves at a first frequency, and a second detector (20) configured to detect second electromagnetic waves separated in a different direction than the first electromagnetic waves at a second frequency lower than the first frequency and to change an amplification factor of a detection signal in accordance with a detection result of the first detector.

13 Claims, 13 Drawing Sheets

(56) References Cited

U.S. PATENT DOCUMENTS

| | | | |
|---|---|---|---|
| 2006/0197936 A1* | 9/2006 | Liebman | G01S 17/42 398/43 |
| 2015/0310281 A1* | 10/2015 | Zhu | G06T 7/246 382/104 |
| 2017/0104314 A1* | 4/2017 | Park | H01S 5/0206 |
| 2017/0357000 A1* | 12/2017 | Bartlett | G01S 7/4814 |
| 2018/0222581 A1* | 8/2018 | Nagasawa | G01S 17/89 |
| 2018/0284229 A1* | 10/2018 | Liu | H03G 3/3084 |
| 2018/0284274 A1* | 10/2018 | LaChapelle | G01S 17/10 |
| 2019/0041517 A1* | 2/2019 | Ichiyanagi | G01S 7/4868 |
| 2019/0294176 A1* | 9/2019 | Ozbilgin | G06V 20/56 |
| 2020/0018858 A1 | 1/2020 | Okada et al. | |
| 2020/0034638 A1* | 1/2020 | Brewington | G05D 1/0231 |

FOREIGN PATENT DOCUMENTS

| | | |
|---|---|---|
| JP | 2007-033055 A | 2/2007 |
| JP | 2011-220732 A | 11/2011 |
| JP | 2017-011634 A | 1/2017 |
| JP | 2018-155649 A | 10/2018 |

* cited by examiner

FIG. 8

| Output signal | Optimal amplification factor |
|---|---|
| E1 | Op1 |
| E2 | Op2 |
| E3 | Op3 |
| ⋮ | ⋮ |

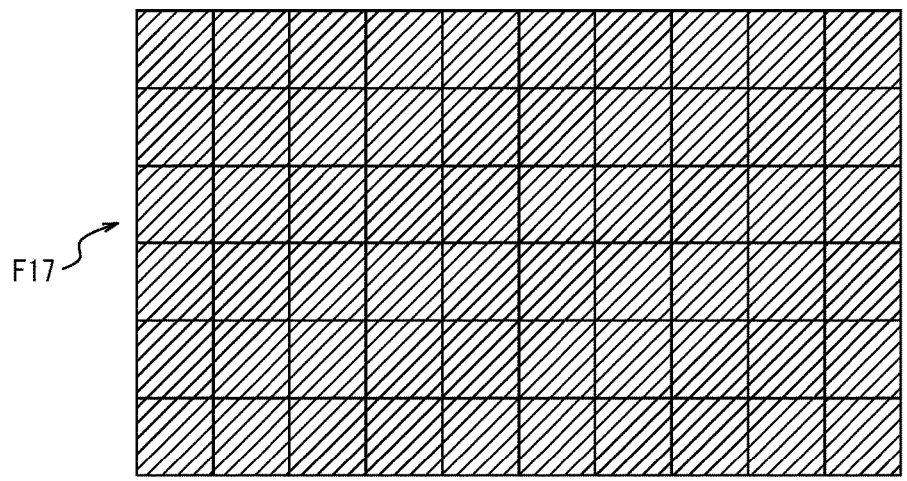
FIG. 11A
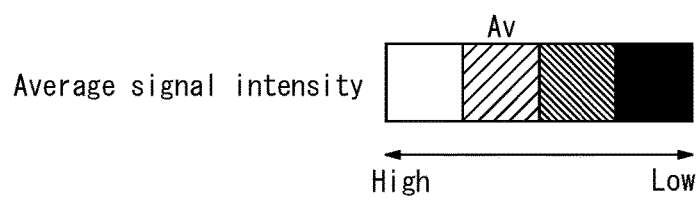
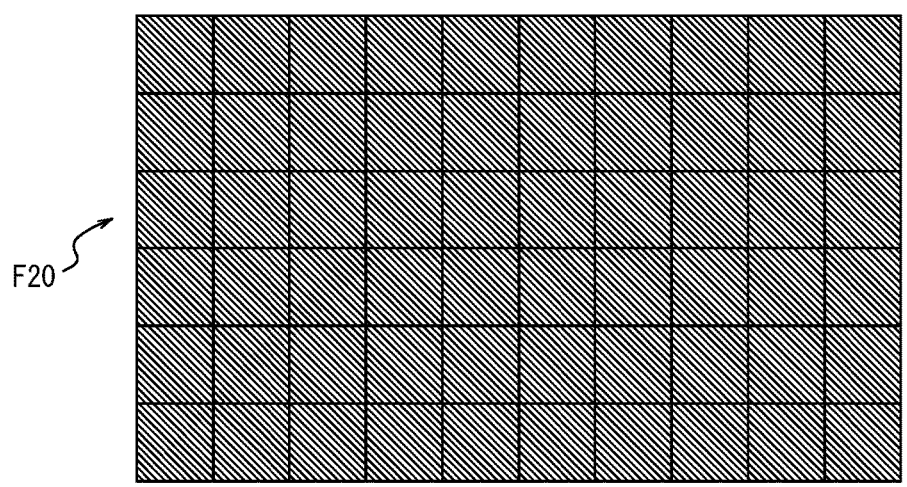
FIG. 11B
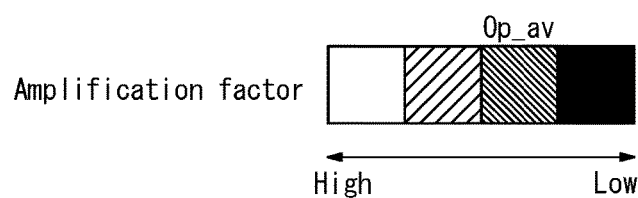

ELECTROMAGNETIC WAVE DETECTION APPARATUS AND INFORMATION ACQUISITION SYSTEM

CROSS-REFERENCE TO RELATED APPLICATION

The present application claims priority to Japanese Patent Application No. 2018-206478 filed on Nov. 1, 2018, the entire contents of which are incorporated herein by reference.

TECHNICAL FIELD

The present disclosure relates to an electromagnetic wave detection apparatus and an information acquisition system.

BACKGROUND

In recent years, apparatuses have been developed to acquire information related to the surroundings from the results of detection by a plurality of detectors that detect electromagnetic waves. For example, an apparatus that uses laser radar to measure the position of an object in an image captured by an infrared camera is known.

SUMMARY

An electromagnetic wave detection apparatus according to a first aspect includes a separation unit configured to separate and propagate incident electromagnetic waves in a plurality of directions, a first detector configured to detect separated first electromagnetic waves at a first frequency, and a second detector configured to detect second electromagnetic waves separated in a different direction than the first electromagnetic waves at a second frequency lower than the first frequency and to change an amplification factor of a detection signal in accordance with a detection result of the first detector.

An information acquisition system according to a second aspect includes an electromagnetic wave detection apparatus and a controller configured to acquire information related to surroundings based on a detection result of electromagnetic waves from a first detector and a second detector.

The solution to the problem in the present disclosure is not limited to the above described apparatuses but rather may be embodied in forms including the apparatus or system, or as a method, program, or storage medium with a program recorded thereon, that substantially correspond to the apparatus or system. These embodiments are to be understood as included within the scope of the present disclosure.

BRIEF DESCRIPTION OF THE DRAWINGS

In the accompanying drawings:

FIG. 8 illustrates an example table of electromagnetic wave intensities and optimal amplification factors;

FIG. 11A illustrates an example of setting an amplification factor of a second detector based on a detection result of a first detector;

FIG. 11B illustrates an example of setting an amplification factor of a second detector based on a detection result of a first detector;

DETAILED DESCRIPTION

An embodiment of an electromagnetic wave detection apparatus according to the present disclosure is now described with reference to the drawings. An electromagnetic wave detection apparatus is configured to detect electromagnetic waves using a plurality of detectors. The electromagnetic wave detection apparatus includes an optical system as a separation unit that separates incident electromagnetic waves and propagates the separated electromagnetic waves to the detectors. This optical system is configured to separate the incident electromagnetic waves into electromagnetic waves of various wavelength bands allocated to the detectors and propagate the electromagnetic waves towards the respective detectors. At least a portion of the detectors are, for example, semiconductor elements provided with an amplification function by having an electric field gradient applied to a silicon semiconductor. When amplifying the detection signal yielded by detection of electromagnetic waves, such a semiconductor element also amplifies noise in accordance with the amplification factor or electromagnetic wave intensity. A high amplification factor or input current therefore does not necessarily yield a good S/N ratio. To address this issue, the electromagnetic wave detection apparatus of the present embodiment sets an optimal amplification factor in accordance with the electromagnetic wave intensity for one detector, in a plurality of detectors, that has at least an amplification function, thereby enabling detection of electromagnetic waves with a good S/N ratio.

Figure 1:
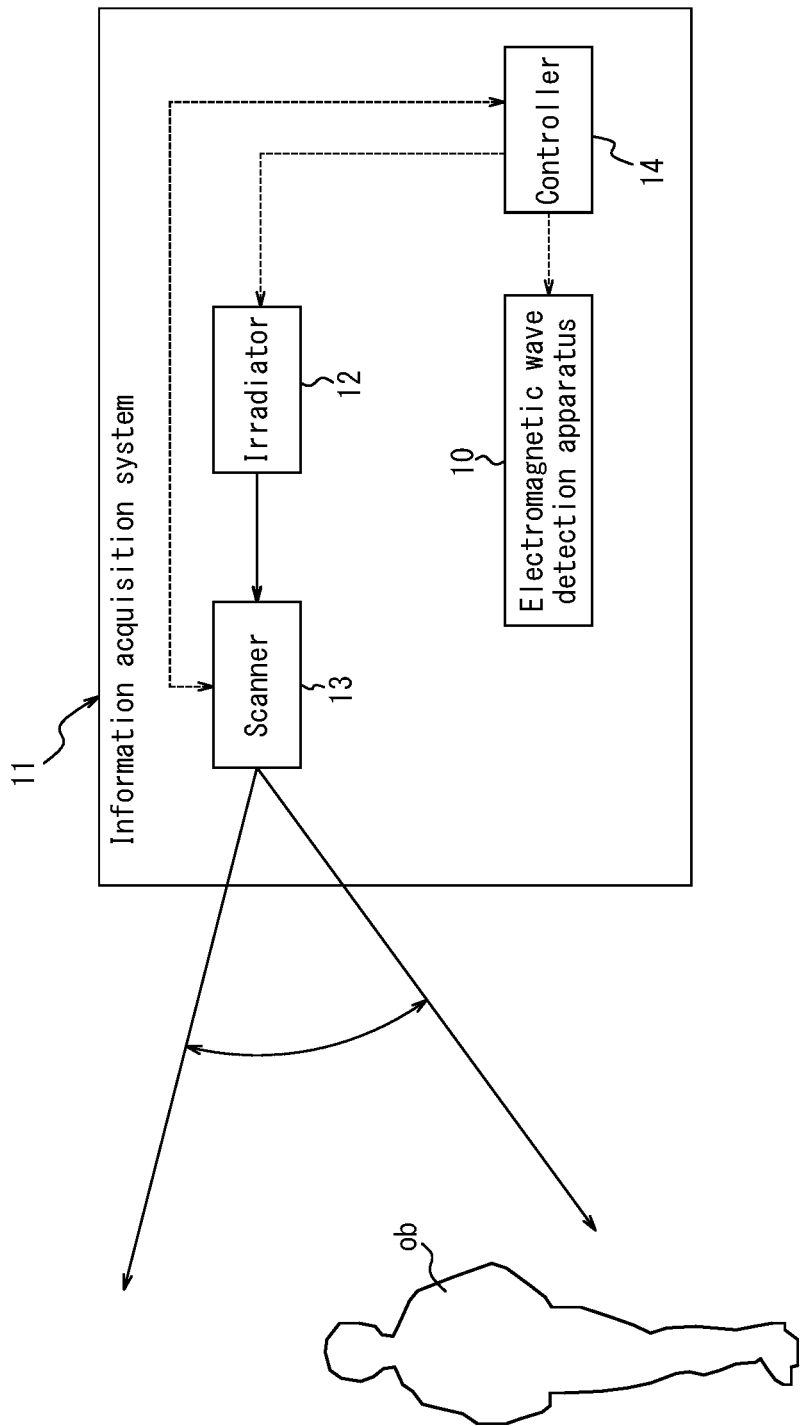
FIG. 1 is a configuration diagram schematically illustrating an information acquisition system that includes an electromagnetic wave detection apparatus according to an embodiment.

As illustrated in FIG. 1, an information acquisition system 11 that includes an electromagnetic wave detection apparatus 10 according to the present embodiment is configured to include the electromagnetic wave detection apparatus 10, an irradiator 12, a scanner 13, and a controller 14.

In the drawings described below, the dashed lines connecting functional blocks indicate the flow of control signals or communicated information. The communication represented by the dashed lines may be wired communication or wireless communication. The solid lines projecting from each functional block indicate beams of electromagnetic waves.

Figure 2:
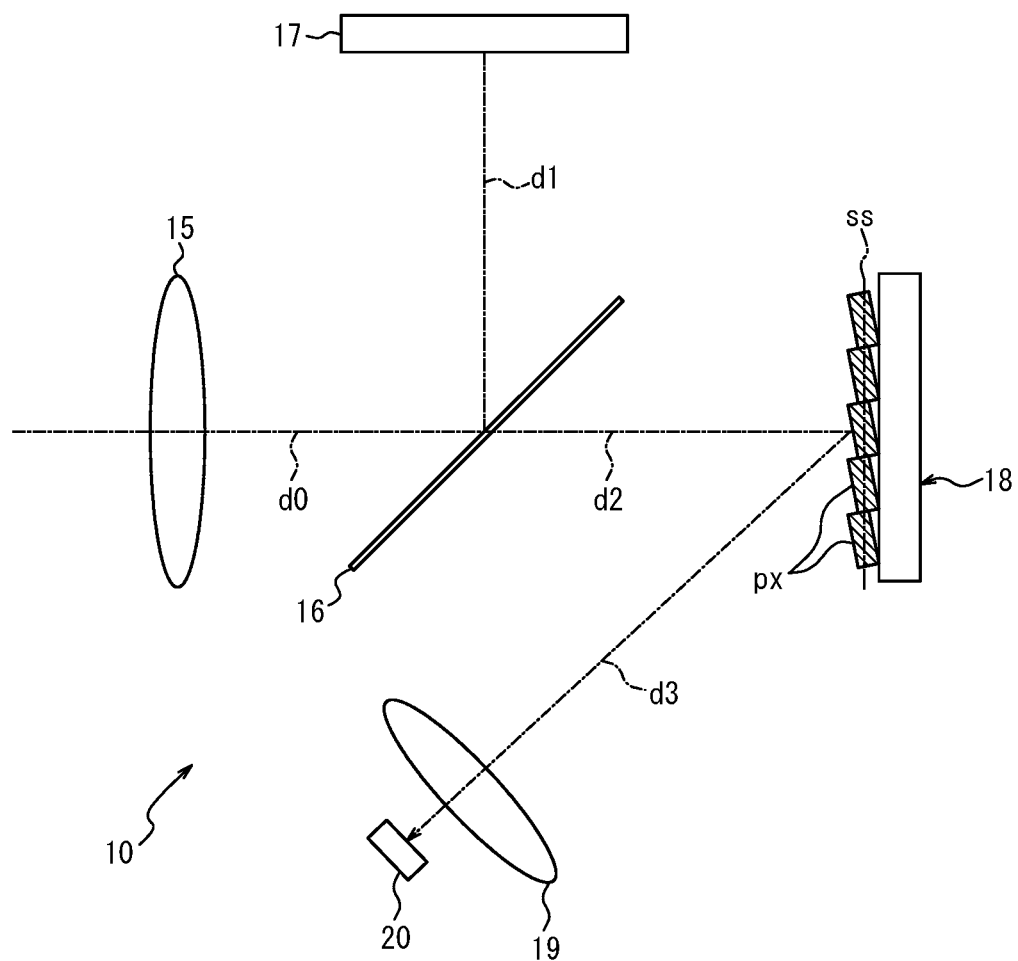
FIG. 2 is a configuration diagram schematically illustrating the configuration of an electromagnetic wave detection apparatus.

As illustrated in FIG. 2, the electromagnetic wave detection apparatus 10 includes a pre-stage optical system 15, a separation unit 16, a detector 17, a propagation unit 18, a post-stage optical system 19, and a detector 20. The detector 17 and 20 respectively correspond to the "first detector" and the "second detector".

The pre-stage optical system 15 includes a lens and/or a mirror, for example, and forms an image of an object ob that becomes a subject of imaging.

The separation unit 16 is provided between the pre-stage optical system 15 and a primary image formation position, which is the position where the image of the object ob located at a predetermined distance separate from the pre-stage optical system 15 is formed by the pre-stage optical system 15.

The separation unit 16 separates electromagnetic waves incident along a direction d0 so that the electromagnetic waves propagate in a direction d1 and a direction d2. The direction d0 of incidence may, for example, be parallel to the optical axis of the pre-stage optical system 15. The separation unit 16 may cause a portion of the electromagnetic waves propagating along the direction d0 of incidence to propagate in the direction d1 and cause another portion of the electromagnetic waves to propagate in the direction d2. The portion of the electromagnetic waves propagated in the direction d1 may be electromagnetic waves of a particular wavelength among the electromagnetic waves propagating along the direction d0, and the electromagnetic waves propagated in the direction d2 may be electromagnetic waves of a different wavelength.

Specifically, the separation unit 16 may propagate electromagnetic waves in the visible light band in the direction d1 and propagate electromagnetic waves in the infrared band in the direction d2, for example. Conversely, the separation unit 16 may propagate electromagnetic waves in the infrared band in the direction d1 and propagate electromagnetic waves in the visible light band in the direction d2. The separation unit 16 may propagate electromagnetic waves with a long wavelength in the direction d1 and propagate electromagnetic waves with a short wavelength in the direction d2. Conversely, the separation unit 16 may propagate electromagnetic waves with a long wavelength in the direction d2 and propagate electromagnetic waves with a short wavelength in the direction d1.

In the present embodiment, the separation unit 16 reflects a portion of the electromagnetic waves propagating in the direction d0 in the direction d1 and transmits another portion of the electromagnetic waves in the direction d2. The separation unit 16 may transmit a portion of the electromagnetic waves propagating in the direction d0 in the direction d1 and transmit another portion of the electromagnetic waves in the direction d2. The separation unit 16 may also refract a portion of the electromagnetic waves propagating in the direction d0 in the direction d1 and refract another portion of the electromagnetic waves in the direction d2. The separation unit 16 includes any of a visible light reflective coating deposited on a prism, a one-way mirror, a beam splitter, a dichroic mirror, a cold mirror, a hot mirror, a metasurface, or a deflection element, for example.

The detector 17 is provided along the path of electromagnetic waves that propagate from the separation unit 16 in the direction d1. Furthermore, the detector 17 is provided at or near an image formation position, which is a position in the direction d1 from the separation unit 16 where the image of the object ob located at a predetermined distance separate from the pre-stage optical system 15 is formed by the pre-stage optical system 15. The detector 17 detects the electromagnetic waves propagated from the separation unit 16 in the direction d1 (or generates a signal indicating the presence of an object in the arrival direction of the electromagnetic waves).

In the present embodiment, the detector 17 is a passive sensor, for example. In greater detail, the detector 17 includes a device array. For example, the detector 17 includes an imaging device such as an image sensor or an imaging array, captures the image formed from electromagnetic waves on a detection surface, and generates image information corresponding to the imaged object ob.

In greater detail, the detector 17 in the present embodiment captures a visible light image. The detector 17 transmits the generated image information to the controller 14 as an image signal. The image signal is, for example, generated for each frame. Each frame is formed by pixel signals in a two-dimensional array. For example, one frame is formed by several hundred to several tens of thousands of pixels per column and several hundred to several tens of thousands of pixels per row. For example, the number of pixels in a frame is 1920×1080. The detector 17 transmits the generated image signal for one frame to the controller 14 every 0.01 s to 0.04 s, for example.

The detector 17 may capture an image other than a visible light image, such as an image of infrared light, ultraviolet light, or radio waves, and generate the corresponding image information. The detector 17 may include a ranging sensor. In this configuration, the electromagnetic wave detection apparatus 10 can acquire distance information in image form with the detector 17. The detector 17 may include a thermosensor or the like. In this configuration, the electromagnetic wave detection apparatus 10 can acquire temperature information in image form with the detector 17.

The propagation unit 18 is provided along the path over which electromagnetic waves propagate from the separation unit 16 in the direction d2. Furthermore, the propagation unit 18 is provided at or near a primary image formation position, which is a position in the direction d2 from the separation unit 16 where the image of the object ob located at a predetermined distance separate from the pre-stage optical system 15 is formed by the pre-stage optical system 15.

In the present embodiment, the propagation unit 18 is provided at the image formation position. The propagation unit 18 has a reference surface ss on which electromagnetic waves that pass through the pre-stage optical system 15 and the separation unit 16 are incident. The reference surface ss is formed by a plurality of pixels px arranged in two dimensions. The reference surface ss produces effects on the electromagnetic waves such as reflection and/or transmission.

The propagation unit 18 propagates the electromagnetic waves that propagate in the direction d2 and are incident on the reference surface ss in another direction d3. On each pixel px, the propagation unit 18 includes a reflecting surface that reflects electromagnetic waves. By changing the orientation of the reflecting surface on each pixel px, the propagation unit 18 can switch the propagation direction of electromagnetic waves, that propagate in the direction d2 and are incident on the reference surface ss, between the direction d3 and yet another direction at each pixel px.

In the present embodiment, the propagation unit 18 includes a digital micro mirror device (DMD), for example. The DMD can drive minute reflecting surfaces that form the reference surface ss to switch the reflecting surface on each pixel px between inclined states of +12 degrees and −12 degrees, for example, relative to the reference surface ss. The reference surface ss is parallel to the board surface of a substrate on which the minute reflecting surfaces are mounted in the DMD.

Based on control by the controller 14, described below, the propagation unit 18 switches the propagation direction of electromagnetic waves, incident on the reference surface ss, at each pixel px.

The post-stage optical system 19 is provided in the direction d3 from the propagation unit 18. The post-stage optical system 19 includes a lens and/or a mirror, for example. The post-stage optical system 19 forms an image of the object ob corresponding to the electromagnetic waves whose propagation direction is switched at the propagation unit 18.

The detector 20 is provided along the path of electromagnetic waves that propagate through the post-stage optical system 19 after propagating in the direction d3 due to the propagation unit 18. The detector 20 detects the electromagnetic waves that passed through the post-stage optical system 19 (or generates a signal indicating the presence of an object in the arrival direction of the electromagnetic waves).

In the present embodiment, the detector 20 is an active sensor that detects reflected waves resulting from reflection, by the object ob, of electromagnetic waves irradiated towards the object ob from the irradiator 12. The detector 20 detects reflected waves, reflected by the object ob, of electromagnetic waves irradiated towards the object ob after being irradiated by the irradiator 12 and reflected by the scanner 13. The electromagnetic waves irradiated from the irradiator 12 are infrared rays, visible light rays, ultraviolet rays, and/or radio waves. The detector 20 detects either a different type or the same type of electromagnetic waves as the detector 17.

In the present embodiment, the detector 20 may be a different type or the same type of sensor as the detector 17. The detector 20 is, for example, a semiconductor element provided with an amplification function by having an electric field gradient applied to a silicon semiconductor. This semiconductor element includes an element forming a ranging sensor, such as an Avalanche PhotoDiode (APD), a Multi-Pixel Photon Counter (MPPC), a Single Photon Avalanche Diode (SPAD), or a ranging image sensor. The detector 20 may include a device array, such as an APD array, a PD array, a ranging imaging array, and/or a ranging image sensor.

In the present embodiment, the detector 20 transmits an amplified detection signal, indicating detection of reflected waves from the subject, to the controller 14. The detector 20 transmits an amplified detection signal to the controller 14 every 0.1 seconds, for example, as an image signal in units of frames or as a signal in a different form. When the detector 20 generates pixel signals in units of frames, one frame is formed by one to several hundred pixels per column and one to several hundred pixels per row. In greater detail, the detector 20 detects electromagnetic waves in the infrared light band.

It suffices for a single device configured as the above-described ranging sensor in the detector 20 to be capable of detecting electromagnetic waves. The electromagnetic waves need not be formed as an image at the detection surface. The detector 20 therefore need not be provided at a secondary image formation position, which is a position of image formation by the post-stage optical system 19. In other words, as long as electromagnetic waves from all angles of view can be incident on the detection surface, the detector 20 may be disposed at any position along the path of electromagnetic waves that are propagated in the direction d3, by the propagation unit 18, and subsequently pass through the post-stage optical system 19.

With reference to FIG. 1, a configuration and operations of each component other than the electromagnetic wave detection apparatus 10 in the information acquisition system 11 that includes the electromagnetic wave detection apparatus 10 is described. The irradiator 12 irradiates infrared rays, visible light rays, ultraviolet rays, and/or radio waves. In the present embodiment, the irradiator 12 irradiates infrared rays. The irradiator 12 irradiates the electromagnetic waves towards the object ob either indirectly via the scanner 13 or directly. In the present embodiment, the irradiator 12 irradiates the electromagnetic waves towards the object ob indirectly via the scanner 13.

The irradiator 12 irradiates electromagnetic waves in a beam with a narrow width, such as 0.5 degrees. In the present embodiment, the irradiator 12 is capable of irradiating pulses of electromagnetic waves. For example, the irradiator 12 includes a light emitting diode (LED), laser diode (LD), or the like. The irradiator 12 switches between irradiating and not irradiating electromagnetic waves based on control by the controller 14.

The scanner 13 includes a reflecting surface that reflects electromagnetic waves, for example, and changes the irradiation position of electromagnetic waves irradiated towards the object ob by reflecting the electromagnetic waves irradiated from the irradiator 12 while changing the orientation of the reflecting surface. In other words, the scanner 13 scans the object ob using the electromagnetic waves irradiated from the irradiator 12. Accordingly, the detector 20 in the present embodiment works together with the scanner 13 to form a scanning-type ranging sensor. The scanner 13 scans the object ob one- or two-dimensionally. In the present embodiment, the scanner 13 scans the object ob two-dimensionally.

The scanner 13 is configured so that at least a portion of an irradiation region of the electromagnetic waves that are irradiated by the irradiator 12 and reflected is included in an electromagnetic wave detection range of the electromagnetic wave detection apparatus 10. Accordingly, at least a portion of the electromagnetic waves irradiated onto the object ob via the scanner 13 can be detected by the electromagnetic wave detection apparatus 10.

In the present embodiment, the scanner 13 is configured so that at least a portion of the irradiation region of the electromagnetic waves that are irradiated by the irradiator 12 and reflected by the scanner 13 is included in the detection range of the detector 20. Accordingly, in the present embodiment, at least a portion of the electromagnetic waves irradiated onto the object ob via the scanner 13 can be detected by the detector 20.

The scanner 13 may, for example, include a micro electro mechanical systems (MEMS) mirror, a polygon mirror, a galvano mirror, or the like. In the present embodiment, the scanner 13 includes a MEMS mirror.

Based on control by the controller 14, described below, the scanner 13 changes the direction in which electromagnetic waves are reflected. The scanner 13 may include an angle sensor, such as an encoder, and may notify the controller 14 of the angle detected by the angle sensor as information on the direction in which electromagnetic waves are reflected (direction information). This configuration enables the controller 14 to calculate the irradiation position based on the direction information acquired from the scanner 13. The controller 14 can also calculate the irradiation position based on a drive signal inputted to the scanner 13 to change the direction in which electromagnetic waves are reflected.

The controller 14 includes one or more processors and a memory. The term "processor" encompasses either or both general-purpose processors that execute particular functions by reading particular programs and dedicated processors that are specialized for particular processing. The dedicated processor may include an application specific integrated circuit (ASIC) for a specific application. The processor may include a programmable logic device (PLD). The PLD may include a field-programmable gate array (FPGA). The controller 14 may include a system-on-a-chip (SoC) and/or a system in a package (SiP) with one processor or a plurality of processors that work together.

The controller 14 acquires information related to the surroundings of the electromagnetic wave detection apparatus 10 based on the detection signals transmitted by the detector 17 and the detector 20. The information related to the surroundings may, for example, be image information, distance information, and/or temperature information. In the present embodiment, the controller 14 acquires image information in the form of electromagnetic waves detected as an image by the detector 17, as described above. Based on the detection information detected by the detector 20, the controller 14 uses the time-of-flight (ToF) method, for example, to acquire distance information of the irradiation position irradiated by the irradiator 12.

The controller 14 causes the irradiator 12 to irradiate pulses of electromagnetic waves by inputting an electromagnetic wave irradiation signal to the irradiator 12. The irradiator 12 irradiates electromagnetic waves based on the inputted electromagnetic wave irradiation signal. The electromagnetic waves irradiated by the irradiator 12 and reflected by the scanner 13 to be irradiated on any appropriate irradiation region are reflected in the irradiation region. The detector 20 switches the orientation of at least a portion of the pixels px in the image formation region, in the propagation unit 18, of the reflected waves of the irradiation region. Upon detecting the reflected electromagnetic waves, the detector 20 notifies the controller 14 of the detection signal. The controller 14 includes a time measurement large scale integrated circuit (LSI), for example, and measures the elapsed time from when the irradiator 12 is caused to irradiate electromagnetic waves until the detection signal is acquired. The controller 14 multiplies the elapsed time by the speed of light and divides by two to calculate the distance to the irradiation position. As described above, the controller 14 calculates the irradiation position based on the direction information acquired from the scanner 13 or the drive signal that the controller 14 outputs to the scanner 13. By changing the irradiation position while calculating the distance to each irradiation position, the controller 14 creates distance information in image form.

Furthermore, the controller 14 in the present embodiment controls the amplification factor of the detection signal of the detector 20 based on the detection signal of the detector 17. Details are provided below.

The information acquisition system 11 is not limited to a configuration that creates distance information by direct ToF, which irradiates a laser beam and directly measures the time until return. For example, the information acquisition system 11 may create distance information by flash ToF, in which electromagnetic waves are irradiated with a constant period, and the time until return is measured indirectly from the phase difference between the irradiated electromagnetic waves and the returning electromagnetic waves. The information acquisition system 11 may also create distance information by another ToF method, such as phased ToF.

In the present embodiment, the detector 20 comprises an amplification function to amplify the detection signal by applying an electric field gradient. The amplification factor of this amplification function increases in accordance with the intensity of the electric field. Strengthening the electric field in order to increase the amplification factor, however, adds shot noise to the amplification process. Strengthening the electric field to increase the amplification factor thus increases the gain of the detection signal but concomitantly increases noise. Hence, the S/N ratio does not necessarily improve. The shot noise also increases in accordance with the intensity of the electromagnetic waves inputted to the detector 20 (i.e. the input current corresponding to the intensity of the electromagnetic waves). Furthermore, when the detector 20 includes an APD, the APD has heat noise caused by temperature. Unlike shot noise, heat noise does not depend on the amplification factor or the input current. The detector 20 thus has mixed noise that combines shot noise accompanying the amplification of the detection signal and heat noise deriving from the APD.

Figure 3:
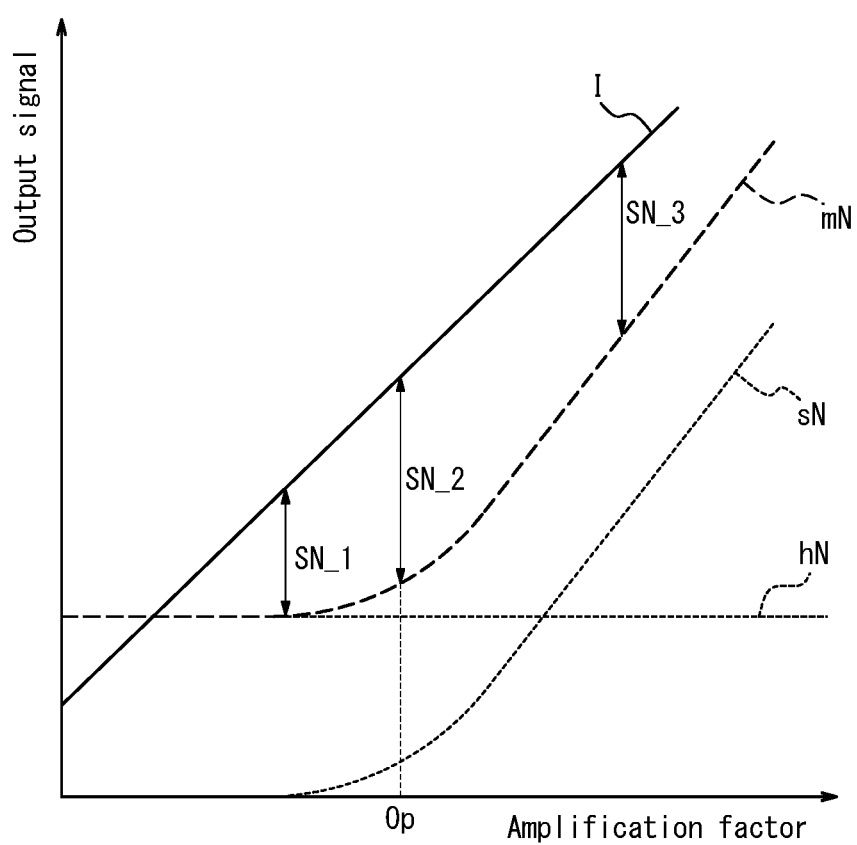
FIG. 3 illustrates amplification factor dependence of mixed noise in a detector.

FIG. 3 illustrates the amplification factor dependence of the mixed noise. In FIG. 3, the horizontal axis represents the amplification factor, and the vertical axis represents the intensity of the output signal. First, a linear amplification of the output signal intensity accompanying an increase in the amplification factor is observed in the input current I. The intensity of the shot noise sN that is mixed into the output signal along with an increase in the amplification factor increases exponentially. On the other hand, the heat noise hN is constant, regardless of the amplification factor. Here, it is clear that the magnitude of the mixed noise mN that combines the shot noise sN and the heat noise hN is generally dependent on the amplification factor.

As illustrated in FIG. 3, the magnitude of the gap between the input current I and the mixed noise mN corresponds to the S/N ratio, which in turn corresponds to the amplification factor. Here, S/N ratios SN_1, SN_2, SN_3 corresponding to an increase in the amplification factor are illustrated. The S/N ratio SN_2 when the amplification factor is Op is greater than the others and represents the best S/N ratio. In this way, a good S/N ratio is not always obtained simply by a large or small amplification factor. The amplification factor yielding the best S/N ratio for the input current is referred to below as the optimal amplification factor (Op).

Figure 4:
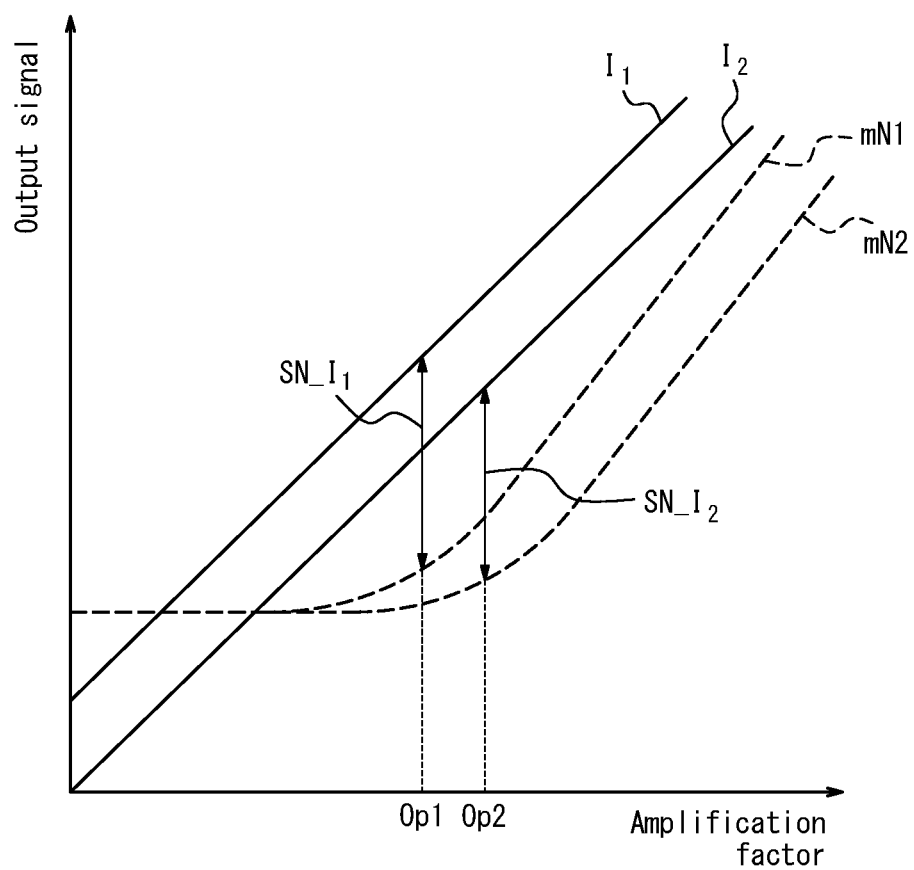
FIG. 4 illustrates input current dependence of mixed noise in a detector.

FIG. 4 illustrates the input current dependence of the mixed noise. In FIG. 4, the horizontal axis represents the amplification factor, and the vertical axis represents the intensity of the output signal. Here, an input current I1 and an input current I2 smaller than the input current I1 are illustrated. A mixed noise mN2 at the time of the input current I2 is equivalent to or smaller than a mixed noise mN1 at the time of the input current I1. In other words, the magnitude of the mixed noise is generally dependent on the magnitude of the input current.

At the time of the input current I1, the best S/N ratio SN_I1 is obtained with the optimal amplification factor Op1 for the mixed noise mN1, as illustrated in FIG. 4. On the other hand, at the time of the input current I2, the best S/N ratio SN_I2 is obtained with the optimal amplification factor Op2 for the mixed noise mN2. FIG. 4 illustrates that the optimal amplification factor Op2 at the time of the input current I2 is greater than the optimal amplification factor Op1 at the time of the input current I1. In other words, the optimal amplification factor differs depending on the input current and tends to decrease as the input current increases.

In consideration of how the detector 20 has mixed noise deriving from the APD, the detector 20 is controlled in the present embodiment to amplify the detection signal at different optimal amplification factors for different input currents. This enables a detection signal with a good S/N ratio to be obtained.

Specifically, the controller 14 first acquires the detection signal of the detector 17. The detector 17 detects electromagnetic waves more frequently than the detector 20. The detector 17 outputs a detection signal with an intensity corresponding to the intensity of the detected electromagnetic waves. Next, when the detector 20 detects electromagnetic waves, the controller 14 controls the amplification factor of the detection signal of the detector 20 based on a control signal of the detector 17. The detector 17 and the detector 20 each detect electromagnetic waves separated from the same electromagnetic waves. The intensity of the detection signal of the detector 17 and the intensity of the detection signal of the detector 20 are therefore equivalent, or at least correlated. For example, when the separation unit 16 is a dichroic mirror, electromagnetic waves (light) with the same conditions other than wavelength are detected by the detectors 17 and 20. Accordingly, the intensity of the electromagnetic waves detected by the detector 20, i.e. the magnitude of the input current, can be estimated based on the intensity of the detection signal of the detector 17. In a suitable example for estimating the intensity of the electromagnetic waves detected by the detector 20 based on the intensity of the detection signal of the detector 17, the difference between the wavelength band of the electromagnetic waves detected by the detector 17 and the wavelength band of the electromagnetic waves detected by the detector 20 is 20000 nm or less, for example. Here, the difference between the wavelength bands may be the difference between the upper limits, the lower limits, the medians, the highest sensitivity wavelength, or the most frequent wavelength of the wavelength bands.

Based on these considerations, the controller 14 sets the optimal amplification factor corresponding to the intensity of the electromagnetic waves detected by the detector 20, i.e. the magnitude of the input current, in the detector 20 based on the intensity of the detection signal of the detector 17. For example, a relatively low amplification factor is set in the detector 20 when the detection signal of the detector 17 indicates a relatively high intensity for the electromagnetic waves, whereas a relatively high amplification factor is set when the detection signal of the detector 17 indicates a relatively low intensity for the electromagnetic waves. The detector 20 thereby outputs a detection signal with a good S/N ratio.

Examples

Operations of the controller 14 in an embodiment are described with reference to FIGS. 5 to 8. In the present example, the detector 17 is an image sensor that captures images of the object ob, and the detector 20 is a ranging sensor that measures the distance to the object ob. For example, the information acquisition system 11 both captures an image of the object ob and measures the distance to the object ob to acquire a captured image and distance information.

Figure 5:
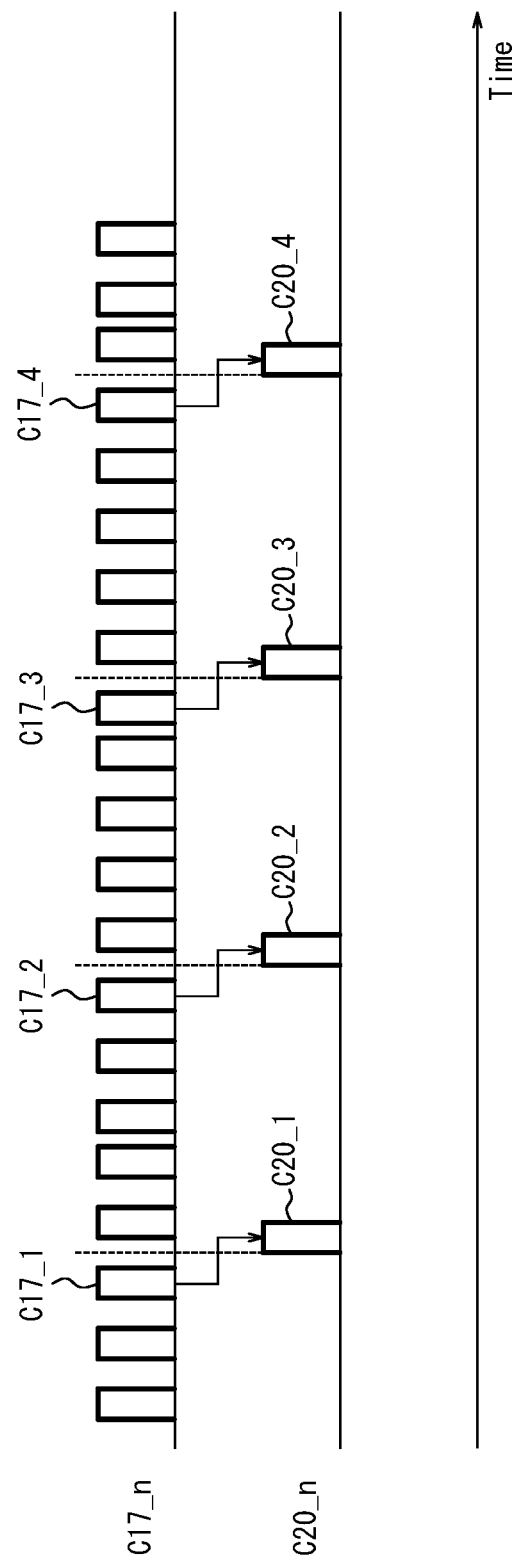
FIG. 5 illustrates a detection frequency of a detector in the present embodiment.

An electromagnetic wave detection (imaging) cycle $C17\_n$ (where n is an integer) of the detector 17 is schematically illustrated in the upper tier of FIG. 5. An electromagnetic wave detection (ranging) cycle $C20\_n$ of the detector 20 is schematically illustrated in the lower tier. The detector 17 captures an image of one frame in each cycle $C17\_n$. On the other hand, the detector 20 detects distance information in image form for each frame from electromagnetic waves in each cycle $C20\_n$. FIG. 5 illustrates how the electromagnetic wave detection frequency (frame rate) of the detector 17 is higher than the electromagnetic wave detection frequency (frame rate) of the detector 20.

Figure 6:
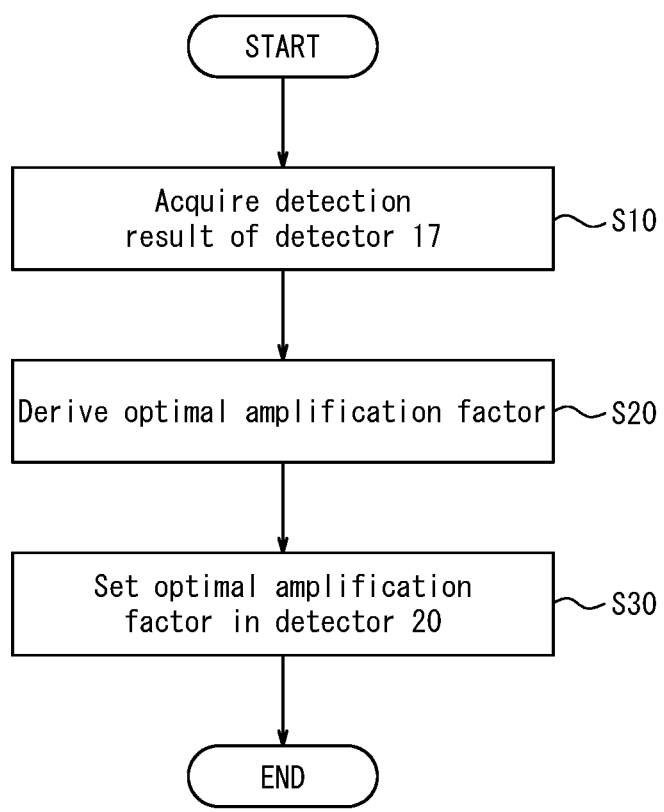
FIG. 6 is a flowchart illustrating operating procedures of a controller.

The controller 14 first acquires the detection result in the cycle $C17\_1$ of the detector 17, i.e. luminance information for the captured image (FIG. 6: step S10). Based on the detection result of the detector 17, the controller 14 then derives the optimal amplification factor of the detector 20 (FIG. 6: step S20).

Figure 7A:
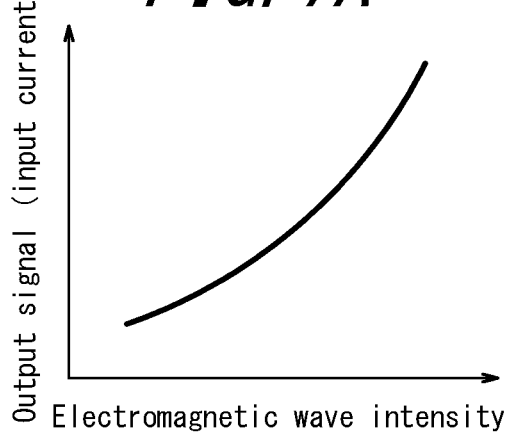
FIGS. 7A, 7B, and 7C illustrate the relationship between electromagnetic wave intensity and amplification factor.
Figure 7B:
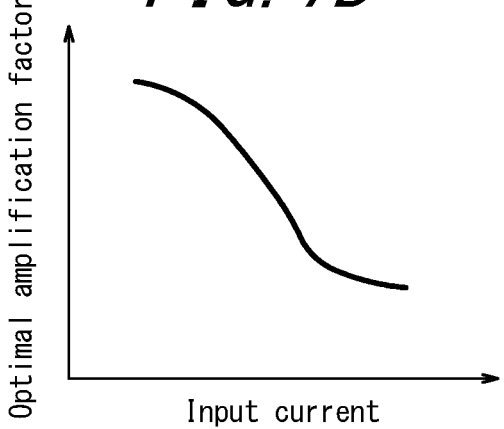
Figure 7C:
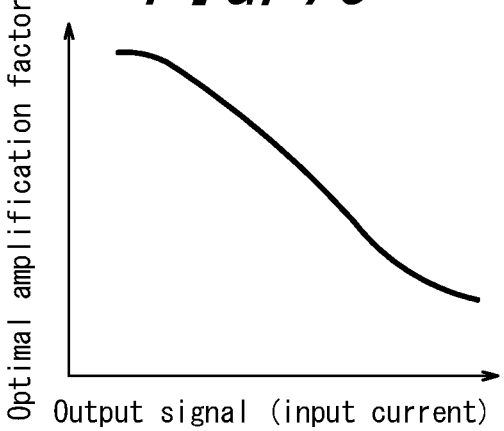

The controller 14 controls the amplification factor of the detector 20 based on the relationship among the following: the intensity of the electromagnetic waves incident on the detector 17 and 20, the input current inputted to the APD in accordance with the electromagnetic wave intensity in the detector 20, and the optimal amplification factor in the detector 20, as illustrated in FIGS. 7A, 7B, and 7C. In other words, as illustrated in FIG. 7A, the intensity of the output signal of the detector 17 (i.e. the input current in the detector 20) increases in accordance with the electromagnetic wave intensity. As illustrated in FIG. 7B, the optimal amplification factor decreases in accordance with the input current in the detector 20. From FIGS. 7A and 7B, the relationship such that the optimal amplification factor of the detector 20 decreases in accordance with the intensity of the output signal from the detector 17 can be obtained, as illustrated in FIG. 7C.

Specifically, the controller 14 stores the relationship between the output signal from the detector 17 and the optimal amplification factor of the detector 20, illustrated in FIG. 7C, in an internal memory in advance. The controller 14 stores table data associating output signals from the detector 17 (E1, E2, E3, . . . ) with the corresponding optimal amplification factor of the detector 20 (Op1, Op2, Op3, . . . ), as illustrated in FIG. 8, in the internal memory in advance. Based on the output signal from the detector 17, the controller 14 uses a relational expression or table to derive the optimal amplification factor of the detector 20 suitable for the electromagnetic wave intensity at the time of the output signal and sets the derived optimal amplification factor in the detector 20. For example, the controller 14 applies voltage corresponding to the optimal amplification factor on the APD of the detector 20. The controller 14 may transmit an instruction signal to apply voltage corresponding to the optimal amplification factor to a control circuit of the APD of the detector 20. The output signal of the detector 20 can thereby be amplified at the optimal amplification factor, yielding a good S/N ratio.

Returning to FIGS. 5 and 6, the controller 14 sets the optimal amplification factor in the detector 20 at the cycle $C20\_1$ of the detector 20, which arrives after the cycle $C17\_1$ (FIG. 6: step S30). The time interval between the end of the cycle $C17\_1$ and the start of the cycle $C20\_1$ can be set as appropriate in accordance with the relationship between the processing speeds of the controller 14 and the detectors 17, 20. When the amplification factor of the detector 20, which has a low frame rate, is controlled using the detection result of the detector 17, which has a high frame rate, the detection result of the detector 17 can be used at a suitable timing to control the amplification factor of each frame of the detector 20 in accordance with the processing speed of the controller 14 and the detectors 17, 20. Rather than attempting to set the optimal amplification factor based on the detection results of the detector 20 itself from previous cycles, for example, the use of the detection results of the detector 17, which has a high frame rate, enables immediate control based on newer detection results.

Subsequently, based on the luminance information of the image captured by the detector 17 in the cycle C17_2, the controller 14 similarly sets the optimal amplification factor in the detector 20 during the cycle C20_2 of the detector 20. Based on the luminance information of the image captured by the detector 17 in the cycle C17_3, the controller 14 sets the optimal amplification factor in the detector 20 during the cycle C20_3 of the detector 20. The amplification factor may thus be controlled in each frame of the detector 20 or may be controlled in intermittent frames of the detector 20 in accordance with the processing speed of the controller 14 and the detectors 17, 20.

For each pixel signal in one frame of the detector 17, the controller 14 in the present example uses the intensity of the pixel signal to set the optimal amplification factor, in the detector 20, for the pixel signal in one frame of the detector 20 corresponding to the pixel signal of the detector 17. Here, the pixel signals in one frame of the detector 17 and the corresponding pixel signals in one frame of the detector 20 are obtained by the detector 17 and the detector 20 each detecting electromagnetic waves arriving from the same direction.

Figure 9A:
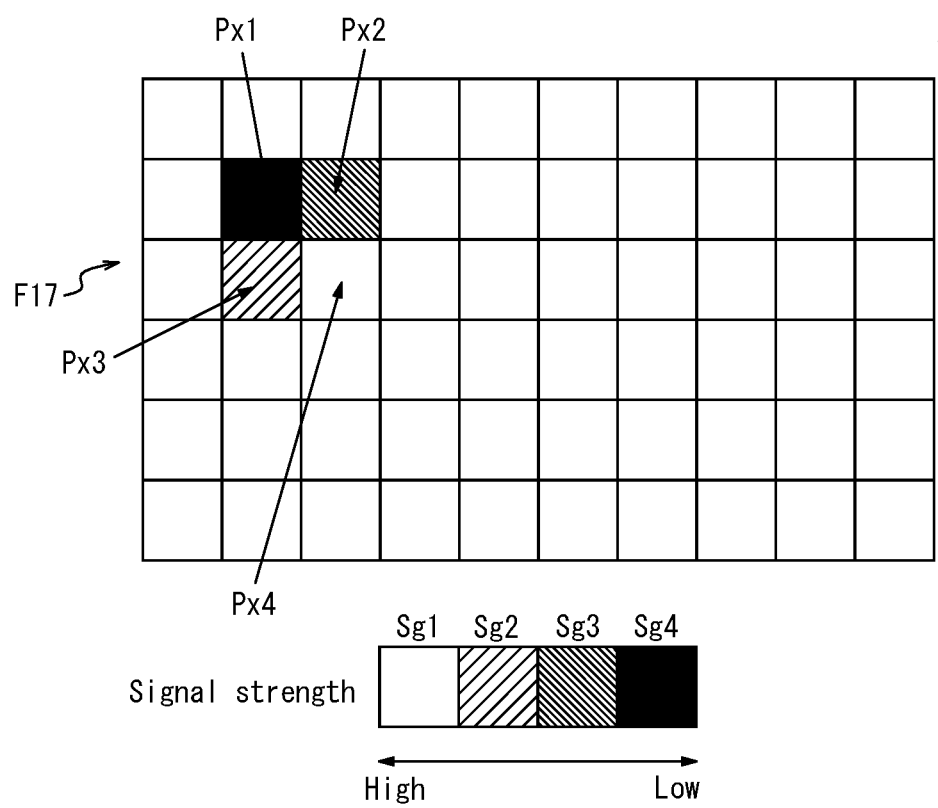
FIG. 9A illustrates an example of setting an amplification factor of a second detector based on a detection result of a first detector.
Figure 9B:
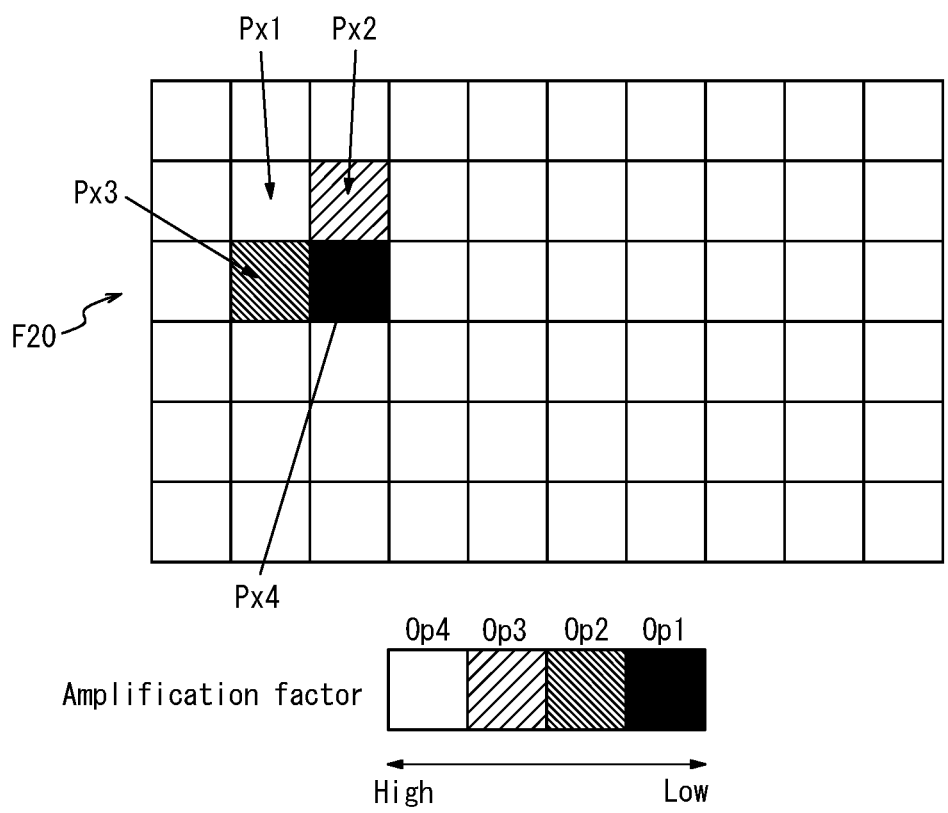
FIG. 9B illustrates an example of setting an amplification factor of a second detector based on a detection result of a first detector.

FIGS. 9A and 9B illustrate examples of the detector 17 and the detector 20 detecting a frame at the same resolution. The pixel signals included in one frame F17 of the detector 17 are schematically illustrated by the squares in FIG. 9A. The intensity of each pixel signal is schematically illustrated in four levels by the density of the hatching. One frame F20 of the detector 20 corresponding to the frame F17 of FIG. 9A is illustrated in FIG. 9B. The pixel signals included in the frame F20 are schematically illustrated by the squares, and the optimal amplification factor of each pixel signal is schematically illustrated in four levels by the density of the hatching. For the sake of explanation, only the pixel signals Px1, Px2, Px3, and Px4 of the frames F17, F20 are illustrated. Based on an intensity Sg4 of the pixel signal Px1 included in the frame F17 of the detector 17, for example, the controller 14 sets an optimal magnification factor Op_4, in the detector 20, for the corresponding pixel signal Px1 in the frame F20 of the detector 20. Similarly, based on an intensity Sg3 of the pixel signal Px2 included in the frame F17, an optimal magnification factor Op_3 for the corresponding pixel signal Px2 in the frame F20 is set in the detector 20. Based on an intensity Sg2 of the pixel signal Px3 included in the frame F17, an optimal magnification factor Op_2 for the corresponding pixel signal Px3 in the frame F20 is set in the detector 20. Based on an intensity Sg1 of the pixel signal Px4 included in the frame F17, an optimal magnification factor Op_1 for the corresponding pixel signal Px4 in the frame F20 is set in the detector 20. When the optimal amplification factor is thus set for each pixel signal, the amplification factor can be finely controlled in the output signal of the detector 20, and a good S/N ratio can be obtained.

<Modification>

In a modification, the controller 14 derives the average intensity of a pixel signal group for each pixel signal group within one frame of the detector 17. The optimal amplification factor corresponding to the average may then be set for the corresponding pixel signal group in one frame of the detector 20. The pixel signals of one frame F17 of the detector 17 and the corresponding pixel signals of one frame F20 of the detector 20 are represented in FIGS. 10A, 10B, 11A, 11B, 12A, and 12B in a similar manner to FIGS. 9A and 9B, respectively.

Figure 10A:
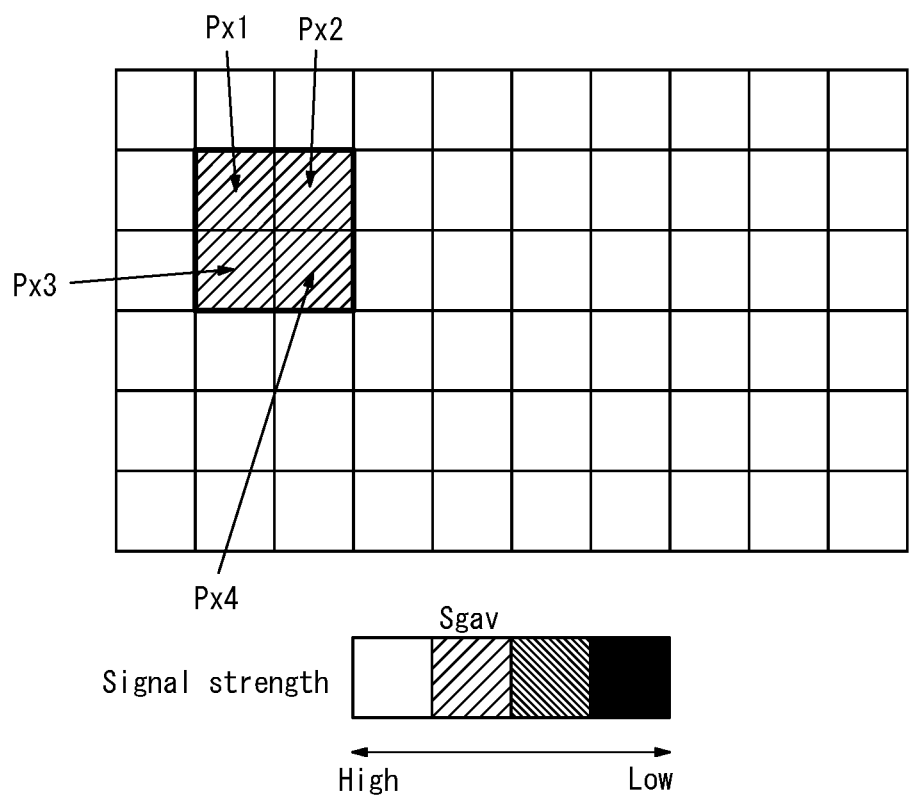
FIG. 10A illustrates an example of setting an amplification factor of a second detector based on a detection result of a first detector.
Figure 10B:
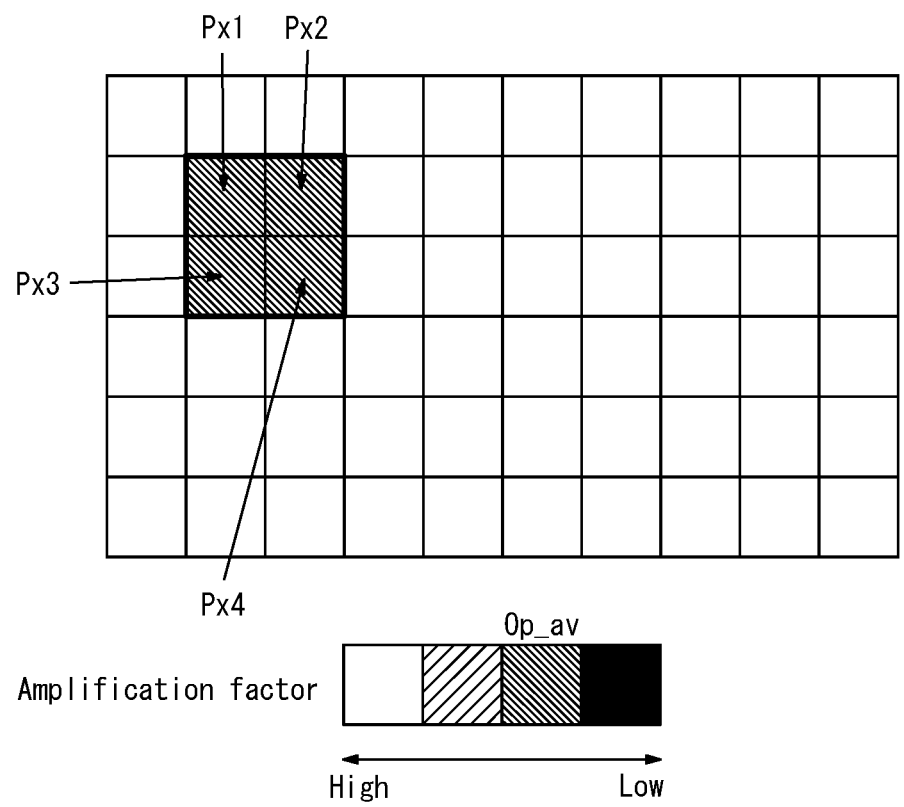
FIG. 10B illustrates an example of setting an amplification factor of a second detector based on a detection result of a first detector.

For example, for the frame F17 of the detector 17 illustrated in FIG. 10A, the controller 14 derives an average Sgav of the intensities Sg4, Sg3, Sg2, Sg1 for respective pixel signals Px1, Px2, Px3, Px4 in a pixel signal group formed by pixel signals Px1, Px2, Px3, Px4. The controller 14 then sets an optimal amplification factor Op_av corresponding to the average Sgav for the corresponding pixel signal group Px1, Px2, Px3, Px4 in the frame F20 of the detector 20 illustrated in FIG. 10B. As illustrated in FIG. 11A, for example, the controller 14 may derive an average Av of all pixel signals included in the frame F17, and as illustrated in FIG. 11B, the controller 14 may set an optimal amplification factor Op_av corresponding to the average Av for all of the pixel signals included in frame F20.

Figure 12A:
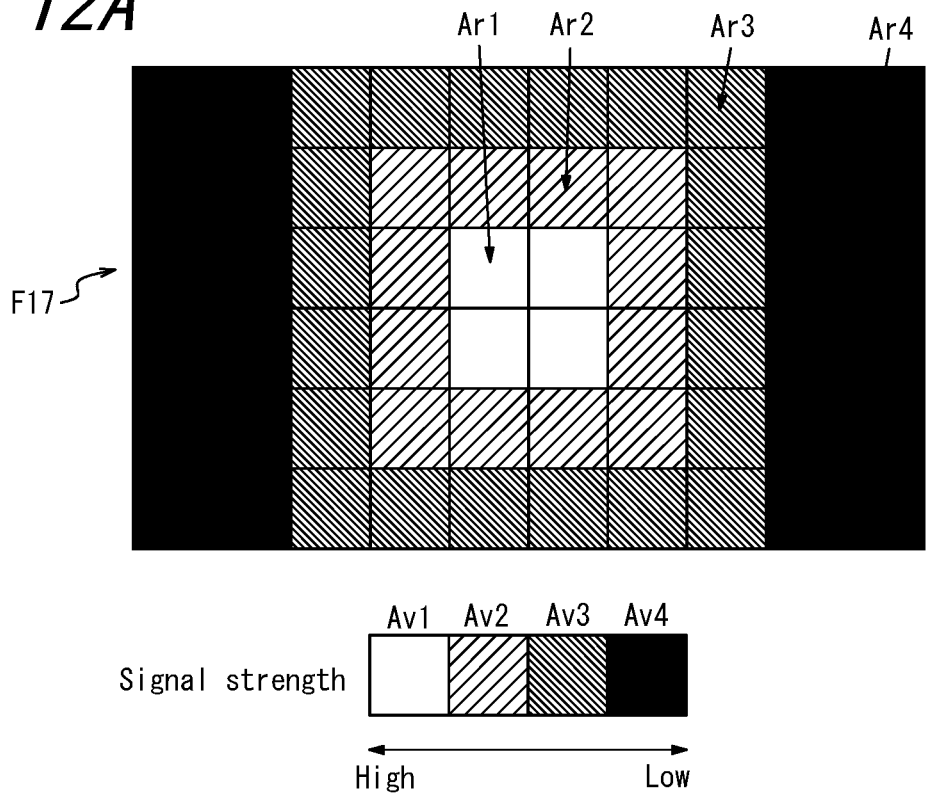
FIG. 12A illustrates an example of setting an amplification factor of a second detector based on a detection result of a first detector.
Figure 12B:
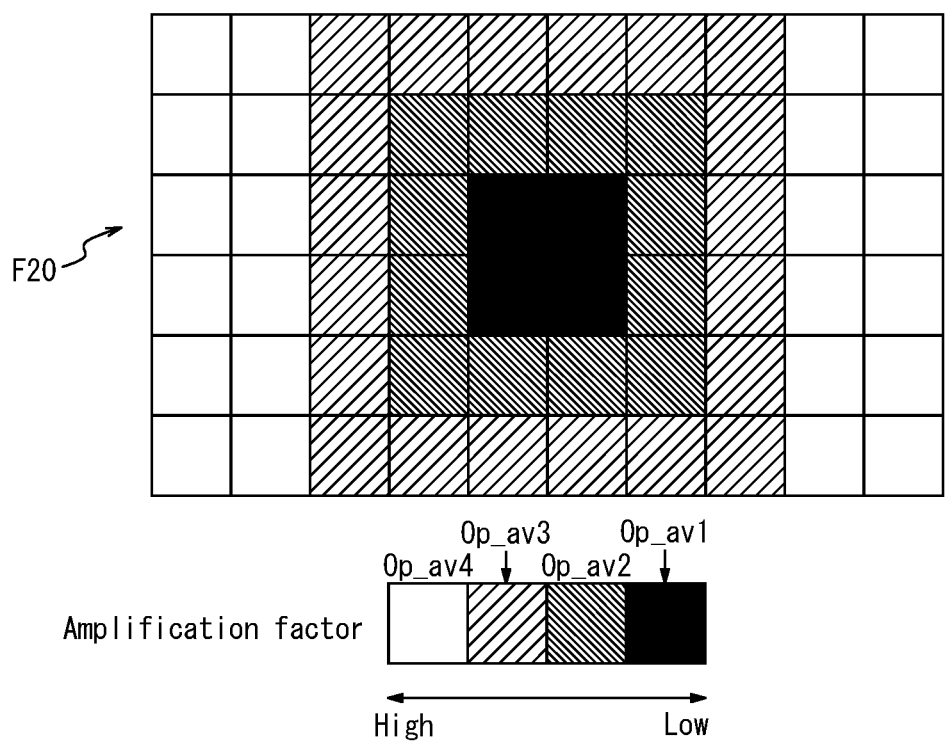
FIG. 12B illustrates an example of setting an amplification factor of a second detector based on a detection result of a first detector.

As illustrated in FIG. 12A, for example, the controller 14 divides the pixel signals included in one frame F17 of the detector 17 into areas Ar1 to Ar4 and derive an average intensity of the pixel signals in each area. As illustrated in FIG. 12B, the controller 14 may then set optimal amplification factors Op_av1 to Op_av4 corresponding to the average intensities Av1 to Av4 in corresponding areas Ar1 to Ar4 of the frame F20. Division of one frame into four areas has been illustrated here, but the number of areas into which a frame is divided is not limited to this example and may be any appropriate number. Setting the optimal amplification factor for each pixel signal group in this way can reduce the processing load for deriving the optimal amplification factor as compared to when the optimal amplification factor is set for each pixel signal.

While acquiring/amplifying one frame worth of detection signals of the detector 20, the controller 14 may set the optimal amplification factor for a portion of the detection signals. Alternatively, the controller 14 may set the optimal amplification factor when acquiring/amplifying only a portion of the detection signals within one frame by controlling any pixels px of the propagation unit 18 in advance.

Furthermore, the controller 14 can perform the following operations when the detector 17 and the detector 20 detect frames at different resolutions. For example, when a plurality of pixel signals in one frame of the detector 20 correspond to one pixel signal in one frame of the detector 17, the controller 14 sets the optimal amplification factor corresponding to the intensity of the pixel signal of the detector 17 for the corresponding plurality of pixel signals of the detector 20. When one pixel signal in one frame of the detector 20 corresponds to a plurality of pixel signals in one frame of the detector 17, the controller 14 calculates the average intensity of the plurality of pixel signals of the detector 17 and sets the optimal amplification factor corresponding to the average for the corresponding pixel signal of the detector 20. In this way, even when the detector 17 and the detector 20 detects frames with different resolutions, the output signal of the detector 20 can be amplified at the optimal amplification factor, yielding a good S/N ratio.

Although an embodiment of the present disclosure has been described on the basis of drawings and examples, it is to be noted that various changes and modifications will be apparent to those skilled in the art based on the present disclosure. Therefore, such changes and modifications are to be understood as included within the scope of the present disclosure.

For example, the irradiator 12, the scanner 13, and the controller 14 form both the electromagnetic wave detection apparatus 10 and the information acquisition system 11, but the electromagnetic wave detection apparatus 10 may be configured to include at least one of these.

The propagation unit 18 can switch the propagation direction of the electromagnetic waves incident on the reference surface ss between two directions, but the propagation unit 18 may instead be capable of switching the propagation direction among three or more directions.

The information acquisition system 11 is configured so that the scanner 13 scans the beam of electromagnetic waves irradiated by the irradiator 12, thereby causing the detector 20 to work together with the scanner 13 and function as a scanning-type active sensor. The information acquisition system 11 is not, however, limited to this configuration. For example, similar effects to those of the present embodiment can be obtained without inclusion of the scanner 13 when the irradiator 12 includes a plurality of irradiation sources capable of irradiating electromagnetic waves radially. This irradiator 12 is configured to function as a scanning-type active sensor by phased scanning in which the irradiator 12 irradiates electromagnetic waves from each irradiation source while shifting the irradiation timing. The information acquisition system 11 can also achieve similar effects to those of the present embodiment, without inclusion of the scanner 13, by irradiating electromagnetic waves radially from the irradiator 12 and acquiring information without scanning, for example.

In the above-described information acquisition system 11, the detector 17 is a passive sensor, and the detector 20 is an active sensor. The information acquisition system 11 is not, however, limited to this configuration. For example, similar effects as in the present embodiment can be achieved in the information acquisition system 11 when the detector 17 and the detector 20 are both active sensors or both passive sensors. When the detector 17 and the detector 20 are both active sensors, the irradiators 12 that irradiate electromagnetic waves towards the object ob may be different or the same. Furthermore, different irradiators 12 may irradiate the same type or different types of electromagnetic waves.

Figure 13:
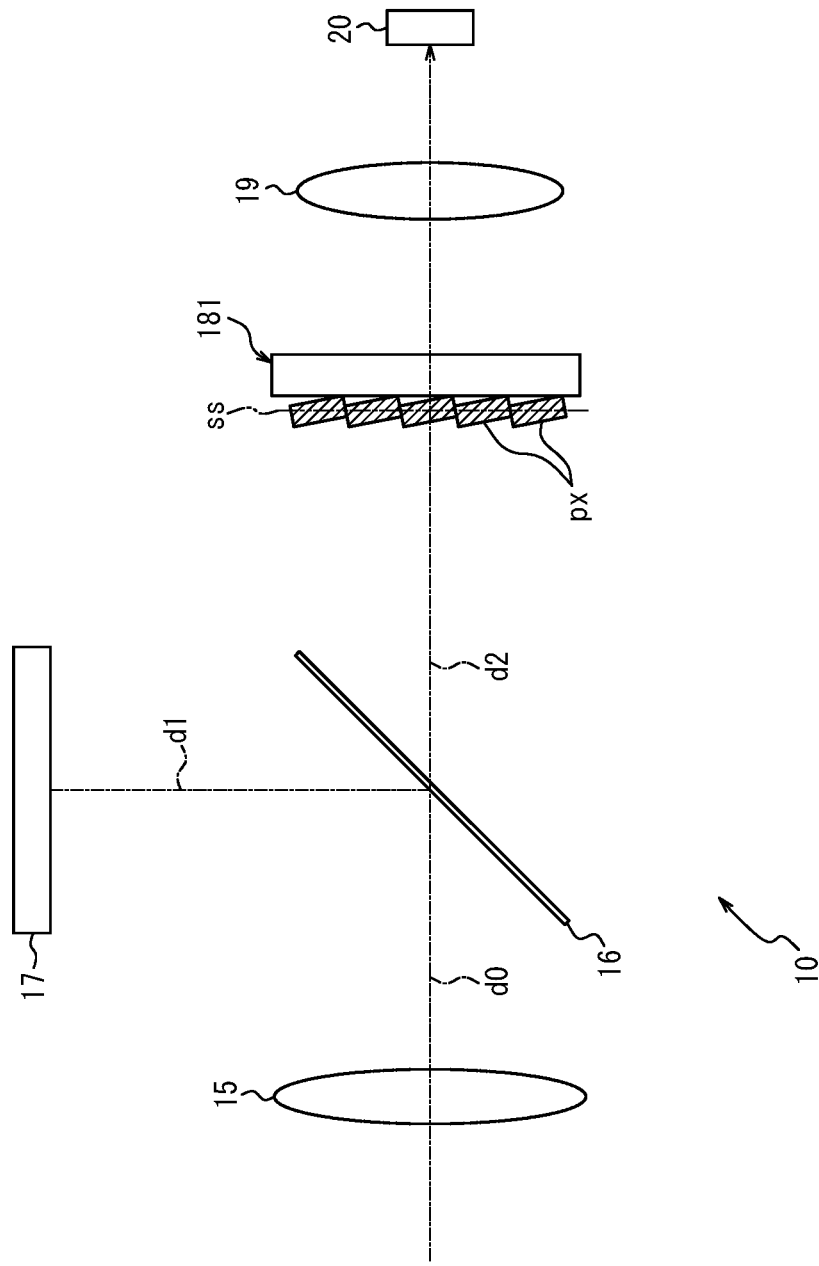
FIG. 13 illustrates a modification to a propagation unit.

As illustrated in FIG. 13, the propagation unit 18 of the present embodiment may be in a transmitting state to transmit the electromagnetic waves incident on the reference surface ss so that electromagnetic waves propagate towards the detector 20. A propagation unit 181 may include a shutter, on each pixel px, that has a reflecting surface that reflects electromagnetic waves in a different direction than electromagnetic waves that are transmitted. The propagation unit 181 with this configuration can open and close the shutter of each pixel px under control by the controller 14 to switch each pixel px between a transmitting state and a reflecting state.

An example of the propagation unit 181 with such a configuration is a propagation unit that includes a MEMS shutter including a plurality of openable shutters arranged in an array. Another example of the propagation unit 181 is a propagation unit that includes liquid crystal shutters capable of switching, in accordance with liquid crystal orientation, between the reflecting state for reflecting electromagnetic waves and the transmitting state for transmitting electromagnetic waves. The propagation unit 181 with this configuration can change the liquid crystal orientation of each pixel px to switch each pixel px between the transmitting state and the reflecting state.

The invention claimed is:

1. An electromagnetic wave detection apparatus comprising:
    a separation unit configured to separate and propagate incident electromagnetic waves in a plurality of directions;
    a first detector configured to detect separated first electromagnetic waves; and
    a second detector configured to detect second electromagnetic waves separated in a different direction than the first electromagnetic waves and to change an amplification factor of a detection signal in accordance with a detection result of the first detector,
    wherein the first detector is configured to detect the first electromagnetic waves more frequently than a rate at which the second detector is configured to detect the second electromagnetic waves.

2. The electromagnetic wave detection apparatus of claim 1, wherein the second detector is configured to change the amplification factor in accordance with a detection result of the first electromagnetic waves detected by the first detector after the second electromagnetic waves are detected.

3. The electromagnetic wave detection apparatus of claim 1, wherein the second detector is configured to set the amplification factor of the detection signal based on a portion of the detection result of the first detector.

4. The electromagnetic wave detection apparatus of claim 1, wherein the second detector is configured to set the amplification factor of the detection signal based on an average of the detection result of the first detector.

5. The electromagnetic wave detection apparatus of claim 1, wherein the amplification factor of the second detector is set by a controller configured to determine the amplification factor based on the detection result of the first detector.

6. The electromagnetic wave detection apparatus of claim 5, wherein the controller is configured to set the amplification factor of the second detector based on an output signal corresponding to an intensity of the first electromagnetic waves detected by the first detector.

7. The electromagnetic wave detection apparatus of claim 1, wherein the separation unit is configured to separate and propagate the incident electromagnetic waves in a plurality of directions in accordance with wavelength.

8. The electromagnetic wave detection apparatus of claim 7, wherein a difference in wavelength band between the first electromagnetic waves and the second electromagnetic waves is 20000 nm or less.

9. The electromagnetic wave detection apparatus of claim 1, further comprising a propagation unit configured to switch a propagation direction of the second electromagnetic waves pixel by pixel and propagate the second electromagnetic waves towards the second detector.

10. The electromagnetic wave detection apparatus of claim 9, wherein the propagation unit comprises a reflecting surface configured to reflect electromagnetic waves on each pixel, and the propagation unit is configured to switch the propagation direction of the second electromagnetic waves between a direction towards the second detector and a direction other than the direction towards the second detector by changing an orientation of the reflecting surface on each pixel.

11. The electromagnetic wave detection apparatus of claim 1, further comprising:
an irradiator configured to irradiate electromagnetic waves; and
a scanner configured to scan using electromagnetic waves irradiated from the irradiator.

12. The electromagnetic wave detection apparatus of claim 1, further comprising:
an irradiator configured to radiate electromagnetic waves;
a scanner configured to change the direction in which the electromagnetic waves are reflected to radiate the electromagnetic waves towards an area where an object exists; and
a controller configured to determine the amplification factor based on the intensity of the first electromagnetic waves incident on the first detector; wherein
the first detector detects electromagnetic waves incident from the area and generates an image signal including a plurality of pixel signals,
the second detector detects reflected waves resulting from reflection by the object of the electromagnetic waves irradiated from the irradiator, and outputs the detection signal, and
the controller measures a distance to the object based on the detection signal of which the amplification factor is changed according to the intensity of the pixel signals.

13. The electromagnetic wave detection apparatus of claim 12, wherein
the second detector obtains distance information by the scanner scanning, at a predetermined time interval, the area where the object exists,
the first detector detects electromagnetic waves in one frame more frequently than the second detector, and
the controller changes the amplification factor of the detection signal output after the first detector generates the image signal.

* * * * *